US006665211B2

United States Patent
Kern

(10) Patent No.: US 6,665,211 B2
(45) Date of Patent: Dec. 16, 2003

(54) MEMORY ARRANGEMENT WITH SELECTABLE MEMORY SECTORS

(75) Inventor: Thomas Kern, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/161,146

(22) Filed: May 31, 2002

(65) Prior Publication Data

US 2003/0002375 A1 Jan. 2, 2003

(30) Foreign Application Priority Data

Jun. 1, 2001 (DE) ......................................... 101 26 799

(51) Int. Cl.$^7$ ............................................. G11C 16/04
(52) U.S. Cl. .............................. 365/185.17; 365/185.11; 365/185.13
(58) Field of Search ....................... 365/185.11, 185.12, 365/185.13, 185.16, 185.17

(56) References Cited

U.S. PATENT DOCUMENTS

| 5,623,443 A | * | 4/1997 | Kazerounian et al. . 365/185.16 |
| 5,646,886 A | * | 7/1997 | Brahmbhatt ........... 365/185.16 |
| 6,072,722 A | | 6/2000 | Hirano ................... 365/185.13 |

* cited by examiner

*Primary Examiner*—Son L. Mai
(74) *Attorney, Agent, or Firm*—Peter F. Corless; Steven M. Jensen; Edwards & Angell, LLP

(57) ABSTRACT

In order to achieve a maximally space-saving configuration of a matricial memory arrangement (1), for example in the form of a non-volatile flash memory, which comprises a plurality of memory cells (3) grouped into memory sectors (2), it is proposed to use regular memory cells (4) of this memory arrangement (1) as sector switches for selecting/activating the respective memory sector (2). In order to avoid the effect of high voltages on the threshold voltage of the memory cells (4) configured as sector switches, the "floating gate" (FG) of these memory cells (4) may be short-circuited to the "control gate" (CG).

16 Claims, 2 Drawing Sheets

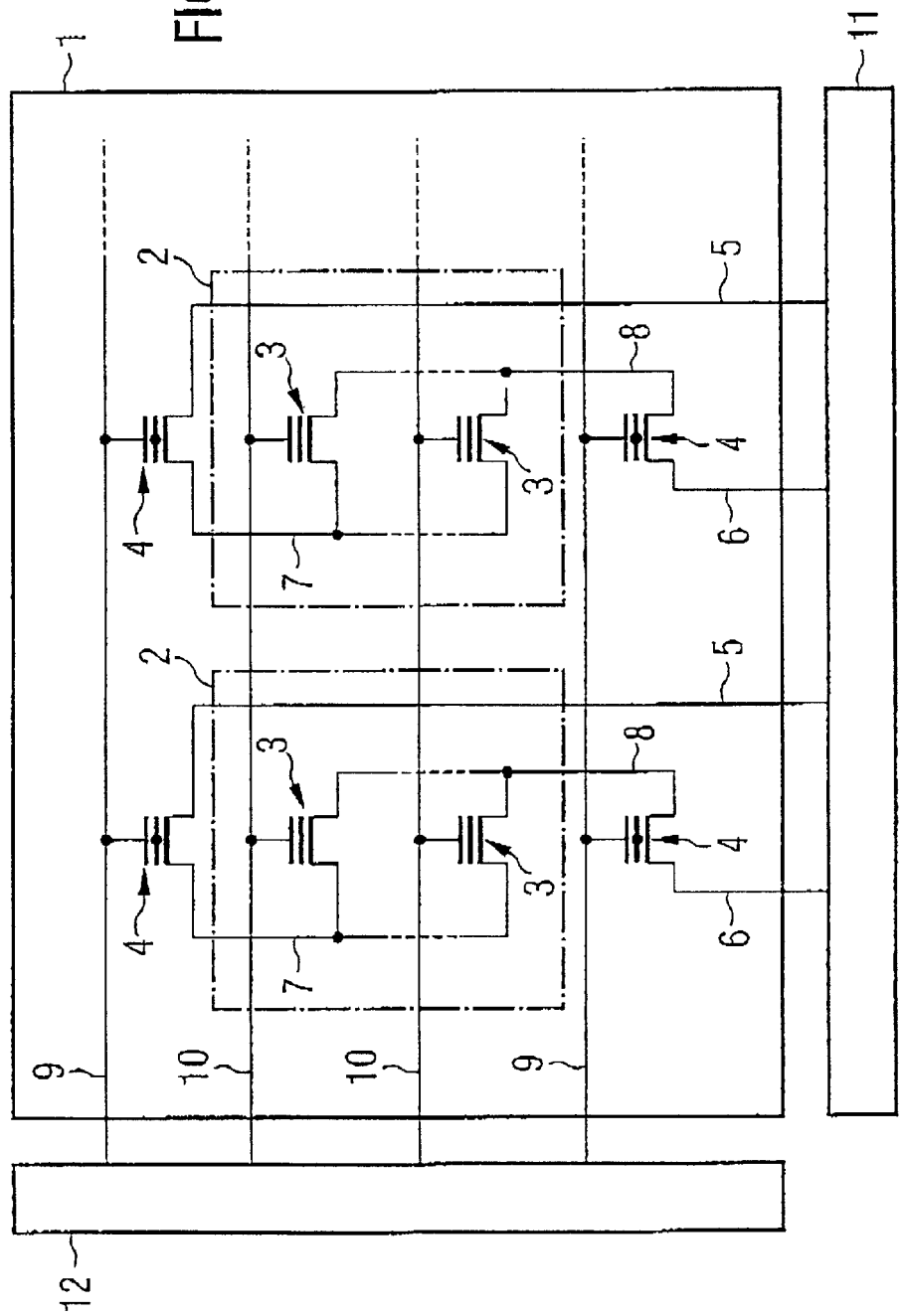

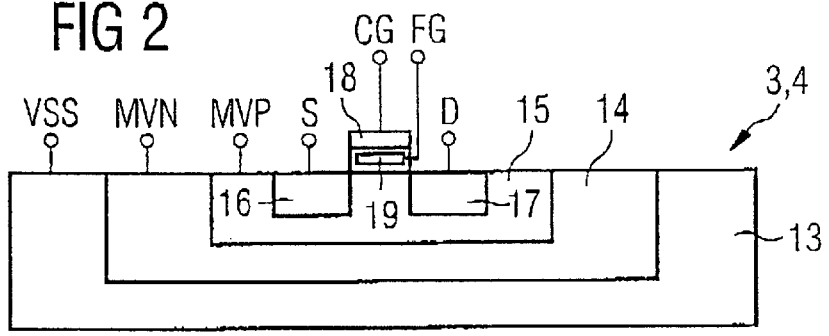
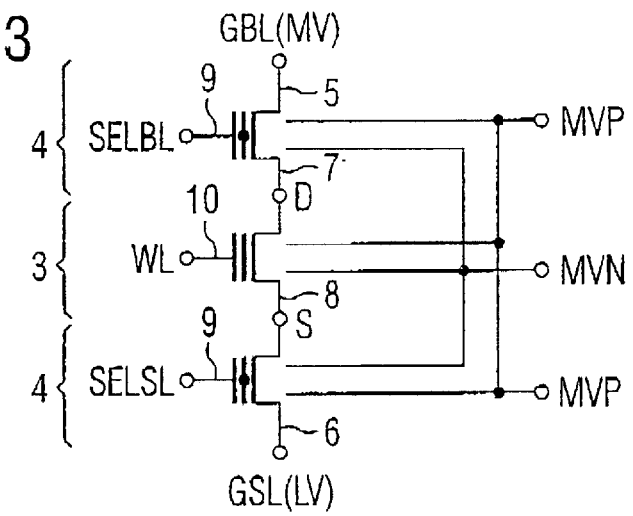
| | WL | D | S | MVN | MVP | SELBL | SELSL |
|---|---|---|---|---|---|---|---|
| ① | +13V | +3V/-3V | Floating | +3V | -3V | +6V/-3V | -3V/+3V |
| ② | -13V | +3V | Floating | +3V | +3V (0V) | +6V | 0V |
| ③ | VDD | 0V | 1,5V | VDD | 0V | VDD | 6V |
FIG 4

MEMORY ARRANGEMENT WITH SELECTABLE MEMORY SECTORS

The present invention relates to a memory arrangement having a plurality of memory cells grouped into memory sectors, the memory cells being arranged in particular matricially, i.e. in rows and columns, and sector switches being used for selecting/activating the individual memory sectors.

Non-volatile flash memories, which may be configured in the form of an external chip or such that they are integrated together with a corresponding logic system, are following the trend towards very large-scale integration just like other memory modules or, for example, logic modules as well. This entails smaller structure widths, with ever-larger memory capacities furthermore being required, in particular so that newer and more modern applications can be run properly. Another challenge due to the respective applications is the increasing need for read performance of the corresponding memory. This is all the more problematic since the read current of the individual memory cells also decreases as the structure widths are reduced. To solve this problem, the memory sectors, of which the respective memory is made up, are therefore to be reduced to such an extent that the respectively required reading speed can be achieved/guaranteed. In order to obtain an economically viable solution under these constraints, the so-called sector overhead, i.e. the ratio of the required drive circuits to the pure memory-cell array, must be as small as possible.

Sector switches are used for selecting/activating the individual memory sectors in conventional memory arrangements, and these sector switches have to date been produced area-intensively in the form of a corresponding logic system and/or corresponding high-voltage transistors. In conventional memory modules, the additional area requirement of the sector switches is, for example, about 20%.

It is therefore an object of the present invention to propose a memory arrangement having a plurality of memory cells grouped into memory sectors, with the possibility of minimising the previously described sector overhead, i.e. the additional area requirement due to the sector switches.

This object is achieved according to the invention by a memory arrangement having the features of claim 1. The dependent claims define respectively preferred and advantageous embodiments of the present invention.

According to the invention, memory cells are used as sector switches in order to solve the aforementioned problem. In order to avoid any effect of high voltages on the threshold voltage of the memory cells configured as sector switches, the "floating gate" of the memory cells may optionally be short-circuited to the "control gate" of the memory cells. This is possible without additional outlay on technology or processing. The sector switches then function as pure MOS transistors, for example as pure NMOS transistors.

The individual memory cells are, in particular, arranged in the form of a memory matrix in rows and columns, for example with the memory cells of one column respectively forming a memory sector, or a memory block. In such a matricial memory arrangement, the drain and source terminals of the individual memory cells may in each case be interconnected via local bit lines and local source lines, respectively. The memory cells which are used as sector switches are then in each case arranged between the local bit line and a global bit line, or the local source line and a global source line, respectively. For an efficient configuration of the memory cells which are used as sector switches, the voltage path needed for programming and erasing is preferably separated from the voltage path needed for reading, the voltage path needed for programming and erasing being a so-called MV ("medium-voltage") path and the read path being an LV ("slow-voltage") path. The MV path is in this case routed via the global bit line to the drain terminal of the memory cell, whereas the control of the memory cell during reading takes place via the source terminal. In this case, en the grounds of performance enhancement, the sector switch present on the global source line may be boosted, for example to 6 V, and the selection of the respective memory sector may be carried out using LV transistors.

The present invention is preferably used to produce non-volatile flash memories. Nevertheless, the present invention is of course not restricted to this preferred application field, but can be applied in general to all types of memory in which memory cells are subdivided in the form of memory sectors, or memory blocks, and selection/activation of the individual memory sectors takes place via corresponding sector switches or sector switching means.

The present invention will be explained in more detail below, with reference to the appended drawing, with the aid of preferred exemplary embodiments.

FIG. 1 shows a simplified representation of a memory arrangement according to a preferred exemplary embodiment of the present invention, FIG. 2 shows a possible embodiment for producing the memory cells shown in FIG. 1, and FIG. 3 and FIG. 4 show representations to illustrate the voltage arrangement for the memory cells shown in FIG. 1.

FIG. 1 represents a memory matrix 1, with a plurality of memory cells 3, 4 being arranged matricially, i.e. uniformly in rows and columns. As will be explained in more detail below, the memory cells 3 are used for storing digital information and are organised into several memory sectors or memory blocks 2, whereas the memory cells 4 are provided as sector switches, i.e. for selecting/activating the respective memory sector 2.

It will be assumed below that the represented memory arrangement is a non-volatile flash memory. Nevertheless, the basic principle of the present invention may of course also be applied to read/write memories with random access.

The memory cells 3, 4 represented in FIG. 1 are driven via a control logic system and driver circuits, so that specific digital information can be stored/programmed or erased in the memory cells 3, or previously stored digital information can be read out from the memory cells 3. To that end, in the exemplary embodiment represented in FIG. 1, a component 12 with a word decoder and drivers is provided, so that the individual memory cells 3, 4 can be addressed/selected via word lines 9, 10. The represented memory cells 3, 4 are in each case configured in the form of an NMOS transistor, the drain terminals of the memory cells 3 being interconnected via a local bit line 7, and the source terminals of the memory cells 3 being interconnected via a local source line 8. The memory cells 3 of each memory sector 2 are coupled, on the one hand, via their drain terminals/the corresponding local bit line 7 and, on the other hand, via their source terminals/the corresponding local source line 8, to a previously mentioned memory cell 4 which fulfils the function of a sector switch. The previously described control logic system comprises a component 11, which is connected via a global bit line 5 to the one memory cell 4 and, via a global source line 6, to the other memory cell 4. The component 11 of the control logic system comprises, for example, a bit-line and source-line decoder in order to select, from the global bit lines 5 and global source lines 6 of the individual memory sectors 2, the bit or source line respectively desired for reading out, programming and erasing digital information.

As has already been mentioned the memory cells 4 are used as sector switches in order to select/to activate the memory sector 2 respectively desired for a memory access, to which end corresponding control voltages are applied to the memory cells 4 via the word lines 9. The memory cells 3, 4 are generally NMOS transistors with a "floating gate". The term "floating gate" is intended to mean a charge stored in an insulated layer over the channel of a field-effect transistor, with the threshold voltage of the transistor being correspondingly shifted by the stored charge on the "floating gate". In order to avoid any effect of high voltages on the threshold voltage of the memory cells 4 which are used as sector switches, the "floating gate" of these memory cells 4 may be short-circuited to the actual programming- or control-gate terminal, which is also referred to as the "control gate", of the corresponding memory cell. This is indicated in FIG. 1 with respect to the memory cells 4 by a solid black circle. The short-circuiting of the "control gate" to the "floating gate" is possible without additional outlay on technology or processing. The sector switches or memory cells 4 then function as pure NMOS transistors.

In the exemplary embodiment represented in FIG. 1, the memory cells 4 configured as sector switches are provided both for the global bit lines 5 and for the global source lines 6 of the individual memory sectors 2. However, the sector switches for the global source lines 6 may also be omitted, depending on the respectively selected cell design and the corresponding voltage arrangement.

Overall, with the aid of the memory arrangement represented in FIG. 1, the area requirement needed for the sector switches, which is essentially attributable to the two additionally required word lines 9, can be reduced to a minimum value since regular memory cells 4 are used as sector switches.

FIG. 2 represents a possible way of producing the individual memory cells, in particular the memory cells 4 which are used as sector switches. As can be seen from FIG. 2, the memory cells are configured in the form of a MOS transistor, it particular an NMOS transistor, with a source terminal S, a "control-gate" terminal CG, a "floating-gate" terminal FG and a drain terminal D, with the memory cell lying in a multiple well. An n-type well 14, on/in which a p-type well 15 is in turn formed, is formed on/in a p-type substrate 13. The memory cell 3, 4 with its source region 16 and its drain region 17 is formed in this p-type well 15. The "control-gate" region 18 and the "floating-gate" region 19 are also represented in FIG. 2. A supply voltage VSS is applied to the p-type substrate 13, whereas voltages MVN/MVP ("medium voltage") are applied to the n-type well 14 and the p-type well 15, respectively. The configuration of the memory cells 3, 4 in a multiple well, which is represented in FIG. 2, has the advantage that the electron flow between the "control gate" and the "floating gate" can be distributed over the entire transistor width, which leads to a homogeneous stress distribution in the component.

FIG. 3 represents a possible way of producing a memory sector 2 with sector switches 4, which is shown in FIG. 1, with the use of the memory-cell design represented in FIG. 2, only one memory cell 3 being represented for the sake of simplicity.

As can be seen from FIG. 3, the memory cell 4 which is used as a sector switch is applied via the global bit line 5 to a bit-line potential GBL, which is in this case an MV potential ("medium-voltage"). The corresponding memory cell 4 is driven via the word line 9, represented in FIG. 1, by means of a voltage potential SELBL, with the aid of which the memory cell 4, or the corresponding sector switch, can be switched into the on state or the off state. The memory cell 4 which is used as a sector switch on the global source line is applied via the global source line 6 to a voltage potential GSL, which is in this case an LV voltage potential ("low-voltage") that is lower than the voltage potential GBL. The latter memory cell 4 is driven via a word line 9, likewise represented in FIG. 1, with the aid of a voltage potential SELSL, in order to switch the corresponding memory cell 4, or the corresponding sector switch, selectively into the on or off state. Between the two memory cells 4 which are used as sector switches, a memory cell 3 is arranged which is respectively linked by its drain terminal D or its source terminal S, as shown in FIG. 3, to the memory cells 4. The "control-gate" terminal of the memory cell 3 is connected via a word line 10, also shown in FIG. 1, to a voltage potential WL, with the aid of which the memory cell 3 can be addressed/selected.

For an efficient configuration of the memory arrangement shown in FIG. 3, the MV ("medium-voltage") path needed for programming and erasing the memory cell 3 is separated from the LV ("low-voltage") read path. The MV path is routed via the global bit line 5 to the drain terminal D of the memory cell 3. The control of the memory cell 3 during reading takes place via the source terminal S. In this case, on the grounds of performance enhancement, the sector switch 4 on the global source line 6 may be boosted, the boosting level being, for example, 6 V. The connection of the voltage potentials MVN and MVP, respectively provided for the wells 14, 15 (compare FIG. 2), to the individual memory cells 3, 4 is also indicated in FIG. 3.

In order to operate the memory arrangement represented in FIG. 3, the voltage potentials indicated in FIG. 3 may be provided with the values represented in FIG. 4; the programming of the memory cell 3 (row (1)), the erasing of the memory cell 3 (row (2)) and the reading out from the memory cell 3 (row (3)) are represented in FIG. 4. For case (2), the voltage value 0 V is indicated in brackets in FIG. 4 with respect to the voltage potential MVP, in the event that the logic system cannot tolerate a voltage at the level of 2.3 V (3 V–0.7 V) on the pn junction. In FIG. 4, VDD furthermore denotes a (positive) supply voltage potential and "floating" denotes a floating or free potential.

What is claimed is:

1. Memory arrangement, comprising a plurality of first memory cells, which are grouped into memory sectors, and in each case are addressable via a word line and connected to at least one bit line for writing and/or reading out digital information, at least one switching means for activating the respective memory sector being allocated to each memory sector, and wherein the switching means are in each case constituted by a second memory cell, the second memory cell being an MOS transistor with a floating-gate terminal and a control-gate terminal, the floating-gate terminal being short-circuited to the control-gate terminal.

2. Memory arrangement according to claim 1, wherein the first memory cells and a plurality of the second memory cells are arranged matricially in rows and columns.

3. Memory arrangement according to claim wherein the memory sectors in each case comprise one column of first memory cells.

4. Memory arrangement according to claim 1, wherein the first and second memory cells are in each case MOS transistors.

5. Memory arrangement according to claim 4, wherein the first memory cells of each memory sector are interconnected, on the one hand, at their source terminals and, on the other hand, at their drain terminals, the second memory cell being connected between the interconnected drain terminals of the first memory cells of the memory sector and a voltage potential.

6. Memory arrangement according to claim 5, wherein the second memory cell, for connecting the memory sector to the voltage potential, and a further second memory cell, for connecting the memory sector to a further voltage potential, are allocated to each memory sector.

7. Memory arrangement according to claim 6, wherein the further second memory cell is connected between the interconnected source terminals of the first memory cells of the respective memory sector and the further voltage potential.

8. Memory arrangement according to claim 6, wherein the voltage potential connected to the one second memory cell is higher than the further voltage potential connected to the further second memory cell.

9. Memory arrangement according to claim 8, wherein the further second memory cell allocated to a corresponding memory sector is boosted for reading out digital information from the first memory cells of the corresponding memory sector.

10. Memory arrangement according to claim 6, wherein the one memory cell connected to the interconnected drain terminals of the first memory cells of a memory sector is connected to the one voltage potential via a bit line provided in common for all first memory cells of this memory sector, and in that the further second memory cell connected to the interconnected source terminals of the first memory cells of a memory sector is connected to the further voltage potential via a source line provided in common for all first memory cells of the respective memory sector.

11. Memory arrangement according to claim 1, wherein the MOS transistor constituting the second memory cell is formed in a well doped with charge carriers of a first charge-carrier type, the well being in turn formed in a further well doped with charge carriers of a second charge-carrier type and the further well being formed on a substance doped with charge carriers of the first charge-carrier type, the first charge-carrier type being the opposite of the second charge-carrier type.

12. Memory arrangement according to claim 1, wherein the memory arrangement is a component of a non-volatile flash memory.

13. A method of using a memory arrangement, comprising:

providing a memory arrangement comprising a plurality of first memory cells, which are grouped into memory sectors, and in each case are addressable via a word line and connected to at least one bit line for writing and/or reading out digital information, wherein a second cell, which belongs to the memory arrangement and is connected to a memory sector, and activating the respective memory sector, the second cell being a MOS transistor with a floating-gate terminal and a control-gate terminal, the floating-gate terminal being short-circuited to the control-gate terminal.

14. The method of claim 13 wherein the memory arrangement compromises a plurality of first and second memory cells arranged matricially in rows and columns, the first memory cells of a column in each case constituting a memory sector, and in that the second memory cells of a column are in each case used for activating the corresponding memory sector of this column.

15. A method for utilizing a memory cell of a memory arrangement as a sector switch, comprising:

providing a the memory arrangement comprising a plurality of first memory cells, which are grouped into memory sectors, and in each case are addressable via a word line and connected to at least one bit line for writing and/or reading out digital information;

activating the respective memory sector with a second cell, which belongs to the memory arrangement and is connected to a memory sector, said second cells being a MOS transistor with a floating-gate terminal and a control-gate terminal, the floating-gate terminal being short-circuited to the control-gate terminal.

16. Memory arrangement, comprising a plurality of first memory cells, which are grouped into memory sectors, and in each case are addressable via a word line and connected to at least one bit line for writing and/or reading out digital information, at least one switching means for activating the respective memory sector being allocated to each memory sector, and wherein the switching means are in each case constituted by a second memory cell, the second memory cell being a MOS transistor formed in a well doped with charge carriers of a first charge-carrier type, the well being in turn formed in a further well doped with charge carriers of a second charge-carrier type and the further well being formed on a substance doped with charge carriers of the first charge-carrier type, the first charge-carrier type being the opposite of the second charge-carrier type.

* * * * *